(12) United States Patent
Finders

(10) Patent No.: US 7,256,870 B2
(45) Date of Patent: Aug. 14, 2007

(54) METHOD AND APPARATUS FOR CONTROLLING ISO-DENSE BIAS IN LITHOGRAPHY

(75) Inventor: Jozef Maria Finders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 201 days.

(21) Appl. No.: 11/046,902

(22) Filed: Feb. 1, 2005

(65) Prior Publication Data

US 2006/0170898 A1 Aug. 3, 2006

(51) Int. Cl.
*G03B 27/54* (2006.01)
*G03B 27/42* (2006.01)
*G03B 27/32* (2006.01)
*G03C 5/00* (2006.01)

(52) U.S. Cl. .................. 355/67; 355/53; 355/77; 430/30

(58) Field of Classification Search ............ 355/53, 355/67, 77, 69; 430/30; 372/20, 25, 3
See application file for complete search history.

(56) References Cited

U.S. PATENT DOCUMENTS

| 5,303,002 | A | 4/1994 | Yan |
| 5,978,394 | A | 11/1999 | Newman et al. |
| 6,348,357 | B2 * | 2/2002 | Sano .......................... 438/16 |
| 6,853,653 | B2 * | 2/2005 | Spangler et al. .............. 372/20 |
| 2001/0026448 | A1 | 10/2001 | Koizumi et al. ............ 362/268 |
| 2002/0048288 | A1 | 4/2002 | Kroyan et al. |
| 2004/0057033 | A1 * | 3/2004 | McCullough et al. ......... 355/53 |
| 2005/0078292 | A1 * | 4/2005 | Bruebach .................... 355/67 |

* cited by examiner

*Primary Examiner*—Alan Mathews
(74) *Attorney, Agent, or Firm*—Pillsbury Winthrop Shaw Pittman, LLP

(57) ABSTRACT

The present invention relates to a lithographic apparatus and a method of using the apparatus in the manufacture of a device such as an integrated circuit (IC). In particular, the present invention relates to a lithographic apparatus wherein iso-dense bias in a printed pattern on a substrate is capable of being controlled by using radiation with a spectral distribution comprising two or more spectral peaks.

26 Claims, 5 Drawing Sheets

METHOD AND APPARATUS FOR CONTROLLING ISO-DENSE BIAS IN LITHOGRAPHY

FIELD

The present invention relates to a lithographic apparatus and a method of using the apparatus in the manufacture of a device such as an integrated circuit (IC). In particular, the present invention relates to a lithographic apparatus wherein iso-dense bias in printed features occurring at different pitches is capable of being controlled by using a spectral energy distribution comprising two or more discrete spectral peaks.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An illumination system is configured to condition a radiation beam and between a reticle and a substrate there is a projection system for imaging an irradiated portion of a reticle onto a target portion of the substrate. The illumination system includes components for directing, shaping or controlling a projection beam of irradiation, and these components typically include refractive optics, reflective optics, and/or catadioptric systems, for example.

Generally, the projection system comprises an optical system to set the numerical aperture (commonly referred to as the "NA") of the projection system. For example, an adjustable NA-diaphragm is provided in a pupil of the projection system. The illumination system typically comprises adjustable elements for setting the outer and/or inner radial extent (commonly referred to as σ-outer and σ-inner, respectively) of an intensity distribution upstream of a mask (in a pupil of the illumination system). A specific setting of σ-outer and σ-inner may be referred to hereinafter as an annular illumination mode. Controlling the spatial intensity distribution at a pupil plane of the illumination system can be used to improve the processing parameters when an image of an illuminated object is projected onto a substrate.

Microchip fabrication involves the control of tolerances of a space or a width between devices and interconnecting lines, or between features, and/or between elements of a feature such as, for example, two edges of a feature. In particular, the control of space tolerance of the smallest of such spaces permitted in the fabrication of the device or IC layer is of importance. The smallest space and/or smallest width is referred to as the critical dimension ("CD"). In general, a single substrate will contain a network of adjacent target portions that are successively exposed.

With conventional projection lithographic techniques it is well known that an occurrence of a variance in CD for isolated features and dense features may limit the process latitude (i.e. the available depth of focus in combination with an allowed amount of residual error in the dose of exposure of irradiated target portions for a given tolerance on CD). This problem arises because features on the mask having the same nominal CD will print differently depending on their pitch on the mask (i.e. the separation between adjacent features) due to pitch dependent diffraction effects. For example, a feature consisting of a line having a particular line width when in isolation (i.e. having a large pitch), will print differently from the same feature having the same line width when together with other lines of the same line width in a dense arrangement on the mask (i.e. having small pitch). Hence, when both dense and isolated features of CD are to be printed simultaneously, a pitch dependent variation of printed CD is observed. This phenomenon is called "iso-dense bias", and is a particular problem in photolithographic techniques. Iso-dense bias is measured in nanometers and represents an important measure for practical characterization of lithography processes.

Conventional lithographic apparatus typically do not directly address the problem of iso-dense bias. It is the responsibility of users of the lithographic apparatus to attempt to compensate for the iso-dense bias by either changing optical parameters of the apparatus, such as the numerical aperture of the projection lens or the σ-outer and σ-inner settings, or by designing the mask in such a way that differences in dimensions of printed isolated and dense features are minimized.

Generally, in a high volume manufacturing site different lithographic apparatus will be used for the same lithographic manufacturing process step to insure optimal exploitation of the machines, and consequently (in view of, for example, machine-to-machine differences) a variance and/or errors in CD may occur in the manufacturing process. Generally, the actual pitch dependency of such errors depends on the specific layout of the pattern and the features, aberrations occurring in the projection system of the lithographic apparatus in use, properties of the radiation sensitive layer on the substrate, and radiation beam properties such as illumination settings, and exposure dose of radiation energy. Therefore, given a pattern to be provided by a patterning device, and to be printed using a specific lithographic apparatus including a specific radiation source, one can identify data relating to iso-dense bias which are characteristic for that process, when executed on that lithographic system. In a situation where different lithographic projection apparatus (of the same type and/or of different types) are to be used for the same lithographic manufacturing process step, there is the problem of mutually matching the corresponding different iso-dense bias characteristics, such as to reduce CD variations occurring in the manufacturing process.

A known technique to match an iso-dense bias characteristic of a machine (for a process whereby an annular illumination mode is used) to an iso-dense bias characteristic of another machine is to change the σ-outer and σ-inner settings, while maintaining the difference between the σ-outer and σ-inner settings (i.e. whilst maintaining the annular ring width of the illumination mode) of one of the two machines. The nominal σ-settings are chosen so as to optimize the process latitude (in particular, the depth of focus and the exposure latitude). In this approach, when the σ-settings are changed, the process latitude becomes smaller and may even become too small for practical use.

US Patent Application No. 2002/0048288A1 relates to an integrated circuit lithographic technique for bandwidth control of an electric discharge laser. The laser beam bandwidth is controlled to produce an effective beam spectrum having at least two spectral peaks in order to produce improved pattern resolution in resist. US Patent Application No. 2002/0048288A1 is incorporated herein by reference.

U.S. Pat. No. 5,303,002 relates to a method and apparatus for patterning a resist layer wherein a plurality of bands of radiation are used to provide an enhanced depth of focus. U.S. Pat. No. 5,303,002 is incorporated herein by reference.

U.S. Pat. No. 5,978,394 relates to a feedback arrangement for controlling a wavelength of a radiation beam. U.S. Pat. No. 5,978,394 is incorporated herein by reference.

One aspect of embodiments of the present invention provides a lithographic apparatus which allows iso-dense bias to be controlled.

A further aspect of embodiments of the present invention provides a method of controlling iso-dense bias in a lithographic apparatus.

SUMMARY

According to an aspect of the present invention, there is provided a lithographic apparatus including an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate, wherein the lithographic apparatus is capable of controlling and substantially maintaining iso-dense bias at a pre-set nominal value when forming a pattern on the substrate by being capable of generating the radiation beam to have a spectral energy distribution comprising two or more discrete spectral peaks.

By iso-dense bias herein is meant a pitch dependent variation of printed critical dimension (CD) when both dense and isolated features are printed substantially simultaneously Using the present invention, it is possible to control iso-dense bias in a lithographic apparatus and thereby have the apparatus operating at a substantially constant value of iso-dense bias throughout the whole period of a processing step. This allows a lithographic apparatus to be initially set up and optimised to operate at a set iso-dense bias (i.e. a nominal setting). This may provide improved pattern resolution.

Instabilities in the lithographic apparatus causing iso-dense bias variations may be a variety of parameters selected from any of the following: drifting of laser bandwidth during use; changes in properties of an illuminator (such as adjustment, set-up and alignment of a projection and optical lens); or changes in photo resist properties (such as processing conditions including bake time and temperature gradient). By measuring the associated iso-dense bias at any specific time, the effect of parameters causing iso-dense bias variations in the lithographic apparatus may be controlled and compensated for by altering a separation between two or more discrete spectral peaks in the radiation beam The procedure of controlling iso-dense bias according to the present invention may be used to control iso-dense bias in a number of different lithographic apparatus. For example, different lithographic apparatus in a high volume manufacturing site may therefore be controlled to operate in the same lithographic manufacturing process step with substantially equivalent values for iso-dense bias. This allows maximum exploitation of different lithographic apparatus which may be present at a specific manufacturing site.

For example, the iso-dense bias in a lithographic apparatus may be controlled and substantially maintained at a substantially constant value of anywhere between about −0.1 to −10 nm, between about −1 to −8 nm and preferably about −5 nm. The pre-set value for the iso-dense bias may be referred to as the nominal setting for the lithographic apparatus.

The iso-dense bias may, for example, be measured by taking a printed wafer and measuring the iso-dense bias in an offline metrology tool such as a CD-SEM (i.e. a Critical Dimension-Scanning Electron Microscope) or a scatterometer. A further method may be to monitor the iso-dense bias inline using techniques such as optical scatterometry. The iso-dense bias may be measured at any pre-determined frequency such as daily, weekly, batch per batch, wafer per wafer or die per die. The frequency of measuring the iso-dense bias may be determined by how much and how often the iso-dense bias may be expected to, or be found to change.

An advantage of being able to control iso-dense bias by using a spectral energy distribution comprising two or more discrete spectral peaks is that the control can be performed during actual operation of the lithographic apparatus and is also quick to effect. In contrast, previous methods to control iso-dense bias involve, for example, changing bias on a reticle. This is time-consuming and may require a considerable amount of 'down-time' for the lithographic apparatus.

Preferably, the spectral energy distribution may comprise two discrete spectral peaks i.e. the radiation beam may be of dual wavelength. Alternatively, the spectral energy distribution may comprise any number of discrete spectral peaks more than two.

Typically, the two or more discrete spectral peaks in the spectral energy distribution may be separated from one another and said separation may be adapted to control iso-dense bias. Therefore, in the event that iso-dense bias in a lithographic apparatus changes from the initially pre-set value (i.e. a nominal setting), then the separation of the two or more discrete spectral peaks may be changed and adapted to compensate for an internal change in the iso-dense bias of the apparatus such as drifting of laser bandwidth. The iso-dense bias may therefore be substantially maintained and controlled at a set value.

Typically, the two or more discrete spectral peaks in the spectral energy distribution may have a separation of less than about 5 pm, less than about 3 pm or less than about 1 pm. Preferably, the two or more discrete spectral peaks in the spectral energy distribution may have a separation of less than about 0.5 pm, less than about 0.25 pm or less than about 0.10 pm. During operation of the lithographic apparatus, the separation of the two or more discrete spectral peaks may be varied within any of these ranges to maintain and control the iso-dense bias at the pre-set nominal value. The separation may be determined by a peak-to-peak separation of the two or more discrete spectral peaks which is sometimes referred to as a modal separation.

Typically, the two or more discrete spectral peaks in the spectral energy distribution may have a spectral bandwidth of about 0.05-0.30 pm and preferably about 0.15 pm.

Preferably, the two or more discrete spectral peaks in the spectral energy distribution may have the same intensity. For example, the two or more discrete spectral peaks may have an energy of about 10-70 mJ/cm$^2$.

In a preferred embodiment, the spectral energy distribution may comprise two discrete spectral peaks having a peak-to-peak separation of about 0.3 pm, a spectral bandwidth of about 0.15 pm and the same intensity in each peak. Operating with a dose of 20 mJ/cm$^2$, a scanspeed of 400 mm/sec and a repetition rate of 4,000 Hz for a laser radiation source, the two separate discrete spectral peaks may each have an energy of about 0.05 mJ per pulse.

The spectral energy distribution comprising two or more spectral peaks may be formed using any suitable technique. For example, a technique referred to as RELAX as described in US Patent Application No. 2002/0048188A1, incorporated herein by reference, may be used. RELAX is an acronym for Resolution Enhancement by Laser-Spectrum Adjusted Exposure and relates to a fast responding tuning mechanism used to adjust center wavelength of laser pulses to achieve a desired spectral distribution. This technique basically involves utilising a piezoelectric drive operating at a suitably high frequency such as about 100-6,000 Hz to oscillate (i.e. vibrate) a tuning mirror. This provides extremely fast movement of the tuning mirror which may be used to form the spectral energy distribution comprising two or more discrete spectral peaks. The piezoelectric drive may operate at substantially the same frequency as a radiation source such an excimer laser. For example, as a KrF excimer laser may operate at about 120 Hz and an ArF excimer laser may operate at between 4,000 Hz to 6,000 Hz, the piezoelectric drive may operate at any of these frequencies. In particular embodiments, the laser may have an operational frequency of about 4,000 Hz or 6,000 Hz The piezoelectric drive may operate substantially in-phase with pulses emitted from a radiation source such as an excimer laser. In alternative embodiments, the piezoelectric drive may operate at substantially a half or substantially a quarter of a frequency of a radiation source The piezoelectric drive may be computer controlled and may respond to updated signals at a frequency of up to about 6,000 Hz. A suitable piezoelectric drive may, for example, be piezo stack Model P-840.10 supplied by Physik Instrumente GmbH in Waldbronn, Germany. In this regard we also refer to U.S. Pat. No. 5,978,394, incorporated herein by reference, which describes extremely fast movement of a tuning mirror.

Oscillating the tuning mirror with the piezoelectric drive, may have the effect of invoking small changes in the wavelength of pulses from a radiation source such as an excimer laser. It may be found that, for example, moving the tuning mirror by about 75 nm has the effect of changing the wavelength between two discrete spectral peaks by about 0.1 pm.

The oscillation of the tuning mirror creates the spectral energy distribution with two or more discrete spectral peaks which may be used to control iso-dense bias. Changing the amplitude of oscillation of the tuning mirror, determines the separation of the two or more discrete spectral peaks and hence the iso-dense bias contribution from the two or more discrete spectral peaks. This may be used to substantially maintain and control the iso-dense bias at an initially pre-set nominal value.

In use, centre wavelengths of the two or more spectral peaks may be measured using a wavemeter unit which allows very fast calculation of the wavelengths. The RELAX technique as discussed in US Patent Application No. 2002/0048288A, incorporated herein by reference, uses a photo diode array and computationally efficient algorithms to allow the wavelength of each pulse of energy from a radiation source to be measured. This calculation procedure may be performed at up to 6,000 times per second.

The iso-dense bias in the lithographic apparatus may be continually monitored and measured so that the iso-dense bias may be known at any specific time. As discussed above, the iso-dense bias may be measured using offline metrology tools such as a CD-SEM or a scatterometer. The measured iso-dense bias may be compared with a pre-set nominal value for a lithographic apparatus for which the apparatus is optimised to operate at. In the event that the measured iso-dense bias changes from the pre-set nominal value, a separation between the two or more spectral peaks of the spectral energy distribution may be adapted (i.e. changed) so as to alter the iso-dense bias until it returns to the pre-set nominal value. On measuring the iso-dense bias, the measured value and the change in value required may be compared with, for example, a computer modelled graph showing how a difference in the separation of the two or more discrete spectral peaks of the spectral energy distribution may be adapted to control and maintain the iso-dense bias at the pre-set nominal value. The computer modelled graph may be created using standard modelling packages such as PROLITH (Trade Mark). PROLITH is available from KLA Tencor in Austin, Tex., United States. It may be found that by plotting separation of two discrete spectral peaks against iso-dense bias produces a substantially parabolic curve.

In embodiments, where iso-dense bias variations occur between different lithographic apparatus, the variations may be controlled by using a spectral energy distribution comprising two or more spectral peaks in the different lithographic apparatus. The iso-dense variations between the different lithographic apparatus may be caused by a variety of parameters such as drifting of the laser during use, changes in properties of an illuminator or changes in photo resist properties. The different lithographic apparatus may therefore be controlled to operate with substantially the same iso-dense bias. This allows maximum usage of different lithographic apparatus at a manufacturing site.

Typically, the radiation beam forming the spectral energy distribution may have a wavelength corresponding to that of Deep Ultra-Violet (DUV). Alternatively, the radiation beam forming the spectral energy distribution used may have a wavelength of between about 50-500 nm or about 100-400 nm. Preferred wavelengths for the radiation beam forming the spectral energy distribution may be about 157 nm, 193 nm, 248 nm or 365 nm.

In alternative embodiments, the radiation beam forming the spectral energy distribution may be Extreme Ultra-Violet (EUV) radiation having a wavelength in the range of about 5-20 nm. Preferably, EUV radiation may have a wavelength of about 13.5 nm.

According to a further aspect of the present invention, there is provided a lithographic apparatus wherein the lithographic apparatus is capable of controlling and substantially maintaining iso-dense bias in a printed pattern on a substrate at a pre-set nominal value by being capable of generating a radiation beam having a spectral energy distribution comprising two or more discrete spectral peaks.

According to a yet further aspect of the present invention, there is provided a device manufacturing method including providing a substrate, providing a conditioned radiation beam using an illumination system, imparting a pattern to the radiation beam, and projecting the patterned beam of radiation onto a target portion of the substrate, wherein iso-dense bias in a printed pattern on the substrate is capable of being controlled and substantially maintained at a pre-set nominal value by being capable of generating the radiation beam to have a spectral energy distribution comprising two or more discrete spectral peaks.

According to a further aspect of the present invention, there is provided a device manufacturing method including projecting a patterned beam of radiation onto a substrate, wherein iso-dense bias in a printed pattern on the substrate is capable of being controlled and substantially maintained at a pre-set nominal value by being capable of generating a radiation beam to have a spectral energy distribution comprising two or more discrete spectral peaks.

According to a further aspect of the present invention, there is provided a device manufactured according to the method of projecting a patterned beam of radiation onto a substrate, wherein iso-dense bias in a printed pattern on the substrate is capable of being controlled and substantially maintained at a pre-set nominal value by being capable of generating a radiation beam to have a spectral energy distribution comprising two or more discrete spectral peaks.

The manufactured device may, for example, be integrated circuits (ICs), integrated optical systems, guidance and detection patterns for magnetic domain memories, liquid crystal displays (LCDs) and thin-film magnetic heads.

According to a further aspect of the present invention, there is provided a lithographic apparatus for controlling the effect of iso-dense bias when forming a pattern on a substrate, said apparatus including a radiation source capable of forming a radiation beam, spectral energy distribution processing system capable of processing the radiation beam to create a spectral energy distribution comprising at least two discrete spectral peaks at different wavelengths and a patterning projection device capable of applying the at least two discrete spectral peaks of the spectral energy distribution substantially simultaneously to create a pattern on a substrate.

According to a yet further aspect of the present invention, there is provided a method of controlling iso-dense bias in a lithographic apparatus, the method including generating a beam of radiation having a spectral energy distribution, processing the spectral energy distribution to create at least two discrete spectral peaks, and projecting the spectral energy distribution with the at least two discrete spectral peaks to form a pattern on a substrate.

According to a further aspect of the present invention there is provided a process for providing lithographic exposures including modelling with a computer program iso-dense bias lithographic parameters to determine a desired laser spectrum needed to produce a desired lithographic result, and utilizing a fast responding tuning mechanism to adjust center wavelength of laser pulses in a burst of pulses to achieve an integrated spectrum for the burst of pulses approximating the desired laser spectrum.

BRIEF DESCRIPTION OF THE DRAWINGS

Embodiments of the present invention will now be described, by way of example only, with reference to the accompanying schematic drawings in which corresponding symbols indicate corresponding parts, in which.

DETAILED DESCRIPTION

Figure 1:
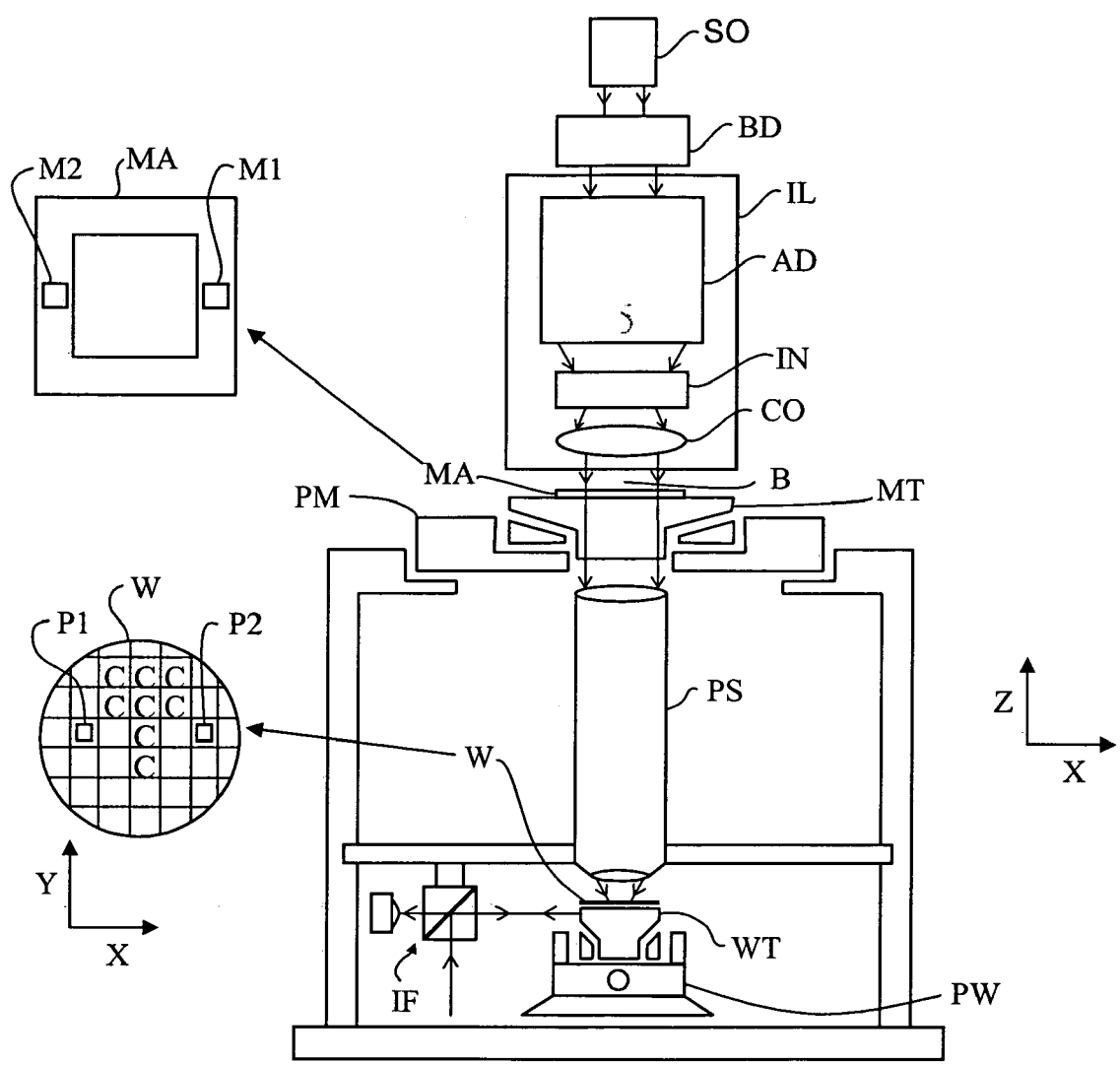
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or EW radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
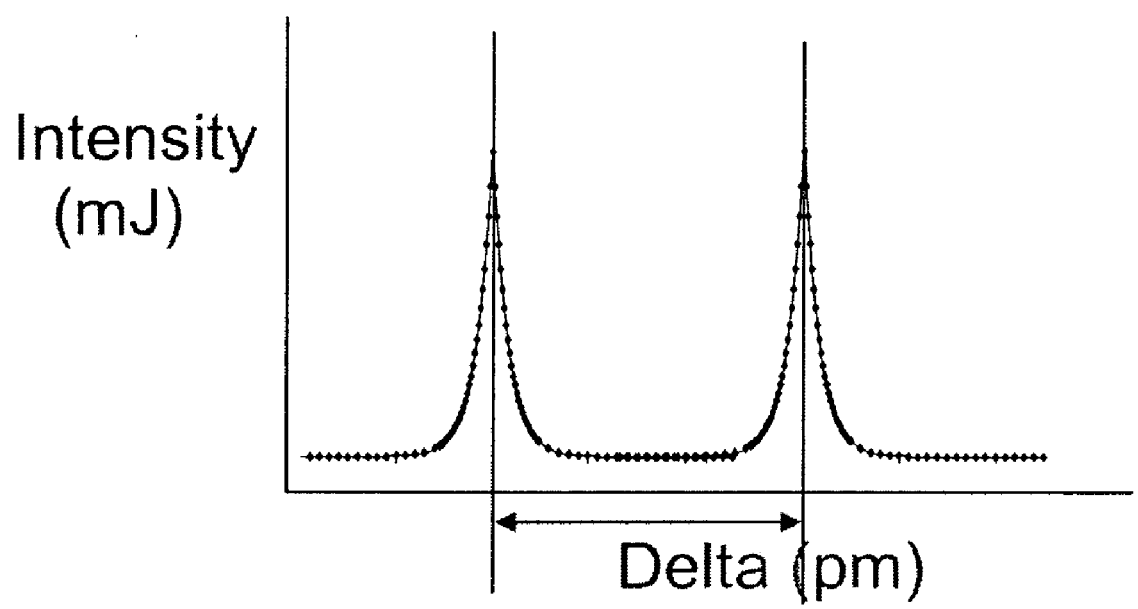
FIG. 2 depicts a separation of two discrete spectral peaks in a spectral energy distribution according to an embodiment of the invention.

FIG. 2 relates to a spectral energy distribution comprising two spectral peaks wherein a separation between the spectral peaks is identified by the delta sign. Using a dose of 20 mJ/cm$^2$, a scanspeed of 400 mm/sec and a repetition rate of 4,000 Hz for a laser radiation source, each peak has an energy of 0.05 mJ per pulse.

The spectral energy distribution shown in FIG. 2 with the two discrete spectral peaks is formed using the RELAX technique as described in US Patent Application No. 2002/0048288A1, incorporated herein by reference. Basically, the technique involves mounting a tuning mirror on a mirror mount. Large changes in the position of the tuning mirror are controlled by a stepper motor through a lever arm. A piezoelectric drive which is computer controlled is used to oscillate the tuning mirror and to control small changes in the movement of the tuning mirror which results in the small changes in the wavelength of the spectral peaks necessary to control the iso-dense bias. The piezoelectric drive operates substantially in-phase with the frequency of a laser acting as a radiation source.

In a particular embodiment using the RELAX technique, a diamond pad at an end of the piezoelectric drive is used to contact a spherical tooling ball at a fulcrum of the lever arm. The mirror mount is attached to the lever arm through a dowel pin on the lever arm and four spherical ball bearings are mounted on the mirror mount. The piezoelectric drive is mounted on a frame of a line narrowing package (LNP). The tuning mirror is mounted in the mirror mount using a three-point mount with aluminium spheres. Springs are used to hold the tuning mirror against the aluminium spheres. In a further alternative embodiment, bellows are used to isolate the piezoelectric drive from the environment inside the LNP. This has the advantage of preventing UV damage to the piezoelectric drive and avoiding possible contamination caused by out-gassing from piezoelectric material.

A preferred embodiment of the present invention is to use an ArF excimer laser system capable of operating in the range of 4,000 Hz to 6,000 Hz. The piezoelectric drive used is piezo stack Model P-840.10 supplied by Physik Instrumente GmbH in Waldbronn, Germany. The piezoelectric drive operates substantially in-phase and at substantially the same frequency as the excimer laser (i.e. 4,000 Hz to 6,000 Hz). Parameters of the laser beam such as pulse energy and center wavelength are measured and controlled at a fast rate by a computer controlled system. The parameters may be measured and controlled as set out in US Patent Application No. 2002/00482288A1, incorporated herein by reference. However, in summary the process involves using a wavemeter processor and photo diode array which is capable of measuring the wavelength of individual pulses occurring in the range of 4,000 Hz to 6,000 Hz. A computer controller using a special algorithm may be used to measure and control pulse energy and wavelength from the excimer laser. As the calculations must be done in real time, the algorithms are specifically chosen to facilitate the fast calculations required.

Figure 3:
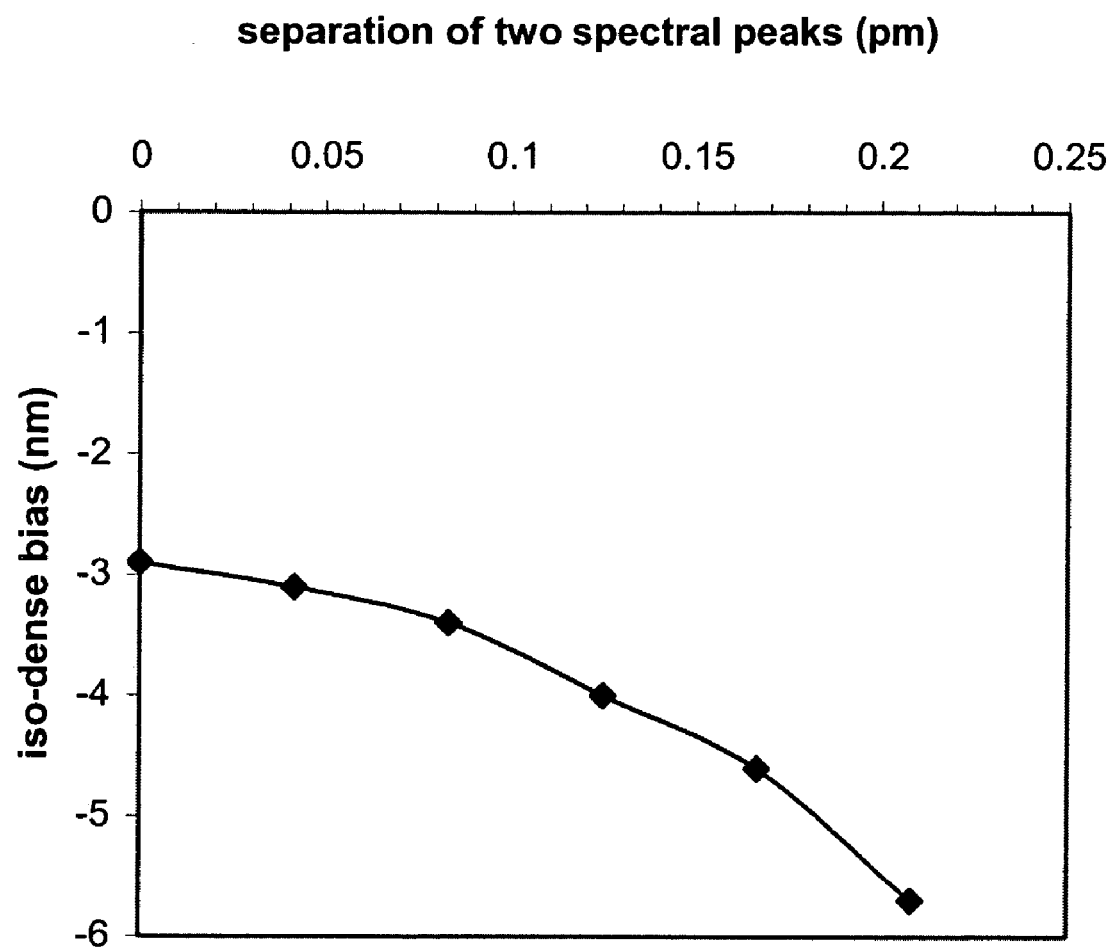
FIG. 3 depicts the effect on iso-dense bias of varying a separation of two discrete spectral peaks in a spectral energy distribution according to an embodiment of the invention.

By changing the amplitude over which the tuning mirror vibrates, affects the separation of the spectral peaks. It is found that by moving the tuning mirror in increments of 75 nm alters the separation of the spectral peaks by 0.1 pm. The movement of the tuning mirror is dependent on the piezoelectric drive which is itself computer controlled FIG. 3 relates to the effect on iso-dense bias of varying the separation between two discrete spectral peaks in a spectral energy distribution as shown in FIG. 2. It is clear from FIG. 3 that as the separation between the spectral peaks increases, the iso-dense bias increases (i.e. the negative value increases). The values shown in FIG. 3 are calculated for 100 nm dense lines and 150 nm isolated lines with an attenuated phase-shift mask wherein the numerical aperture (NA) is 0.75. The σ-outer setting is 0.85 and the σ-inner setting is 0.55. The graph in FIG. 3 is generated using industry standard modeling packages such as PROLITH (Trade Mark)

In FIG. 3, the plot of separation between the two spectral peaks versus iso-dense bias is substantially parabolic in shape. This means that a nominal working point (i.e. wavelength split) for the two spectral peaks should be chosen in such a way that the separation is not too close to zero, otherwise not enough control may be obtainable.

Figure 4:
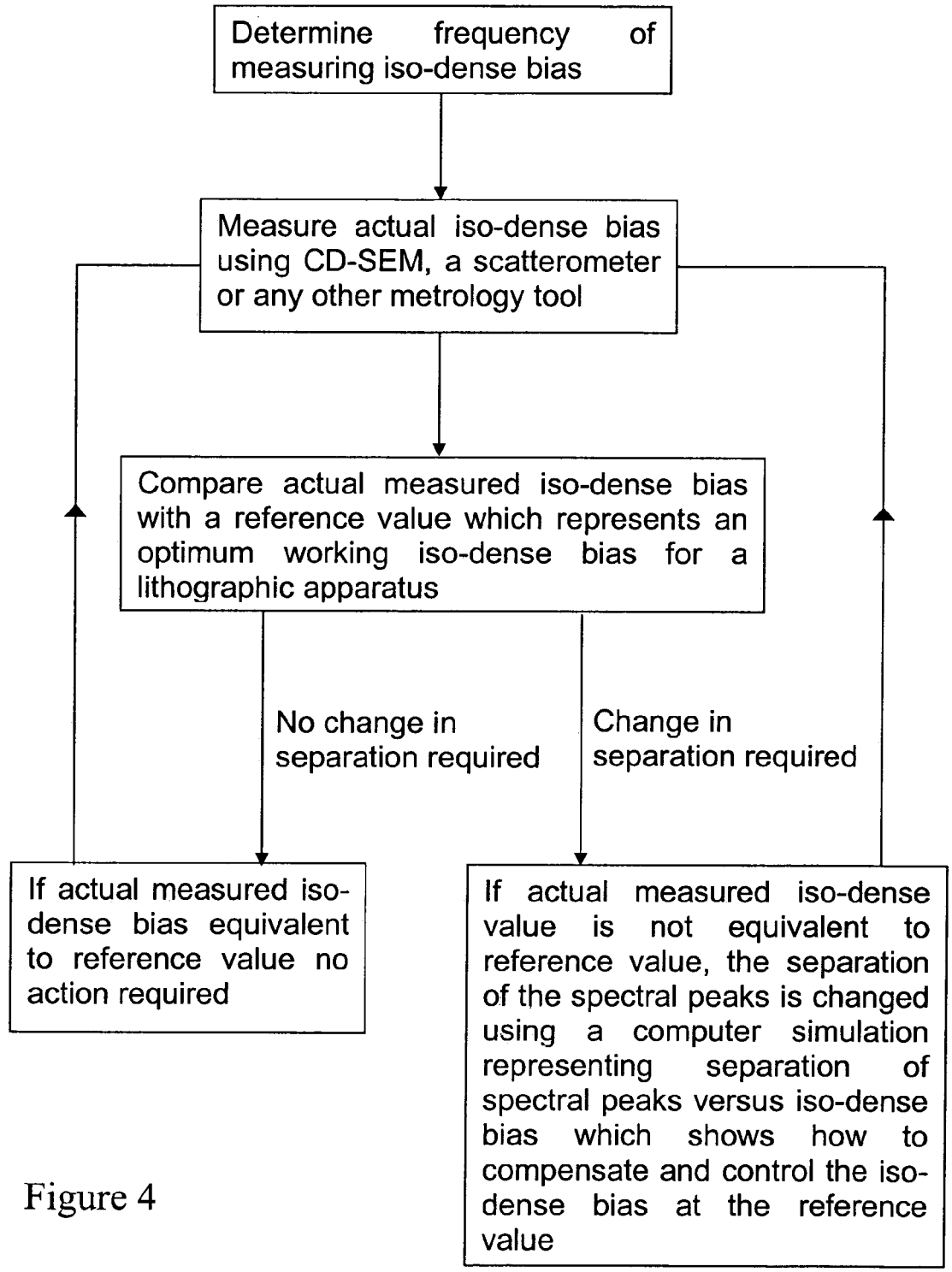
FIG. 4 depicts a flow chart representing a procedure of measuring and controlling iso-dense bias in a lithographic apparatus according to an embodiment of the invention.

FIG. 4 represents a simple flowchart representing steps involved in controlling the iso-dense bias in a lithographic apparatus.

The first step of the flowchart shown in FIG. 4, is to determine how frequently the iso-dense bias should be measured. For example, the iso-dense bias can be measured daily, weekly, batch per batch, wafer per wafer or die per die.

The second step in the flowchart of FIG. 4 is to measure the iso-dense bias. The iso-dense bias may be measured using an offline metrology tool such as CD-SEM, a scatterometer or any other suitable metrology tool. The iso-dense bias may also be measured inline using an optical scatterometer. It should be noted that measuring the iso-dense bias wafer per wafer or die per die is only possible in combination with certain types of metrology tools such as inline metrology tools incorporated into the lithographic apparatus.

The third step is to compare the actual measured iso-dense bias with a reference value which represents a nominal working iso-dense bias for which the lithographic apparatus has been optimized during set up. For example, the reference value for the iso-dense bias may be −5 nm. On comparison of the actual measured iso-dense bias with the reference value (i.e. the nominal working iso-dense bias), if these values are equivalent, then no action needs to be taken and the separation of the spectral peaks therefore does not need to be changed. The iso-dense bias is then measured again which is determined by the frequency of measurements and the process is repeated.

However in the third step, if the actual measured iso-dense bias is not equivalent to the reference value for the nominal working iso-dense bias, then the separation of the spectral peaks needs to be changed. The amount of change in the separation of the spectral peaks is determined by a computer simulation representing separation of spectral peaks versus iso-dense bias as shown in FIG. 3. The separation of the spectral peaks is therefore changed using the parabolic curve of spectral peak separation versus iso-dense bias to control and maintain the iso-dense bias of lithographic apparatus at the nominal working iso-dense bias for the lithographic apparatus i.e. the reference value. The above process is then repeated with further measurements taken for the iso-dense bias and further changes to the spectral peak separation effected if necessary.

If a significant change is required in the separation of the spectral peaks, then the frequency of measuring the iso-dense bias should be made more frequent.

EXAMPLE 1

Figure 5:
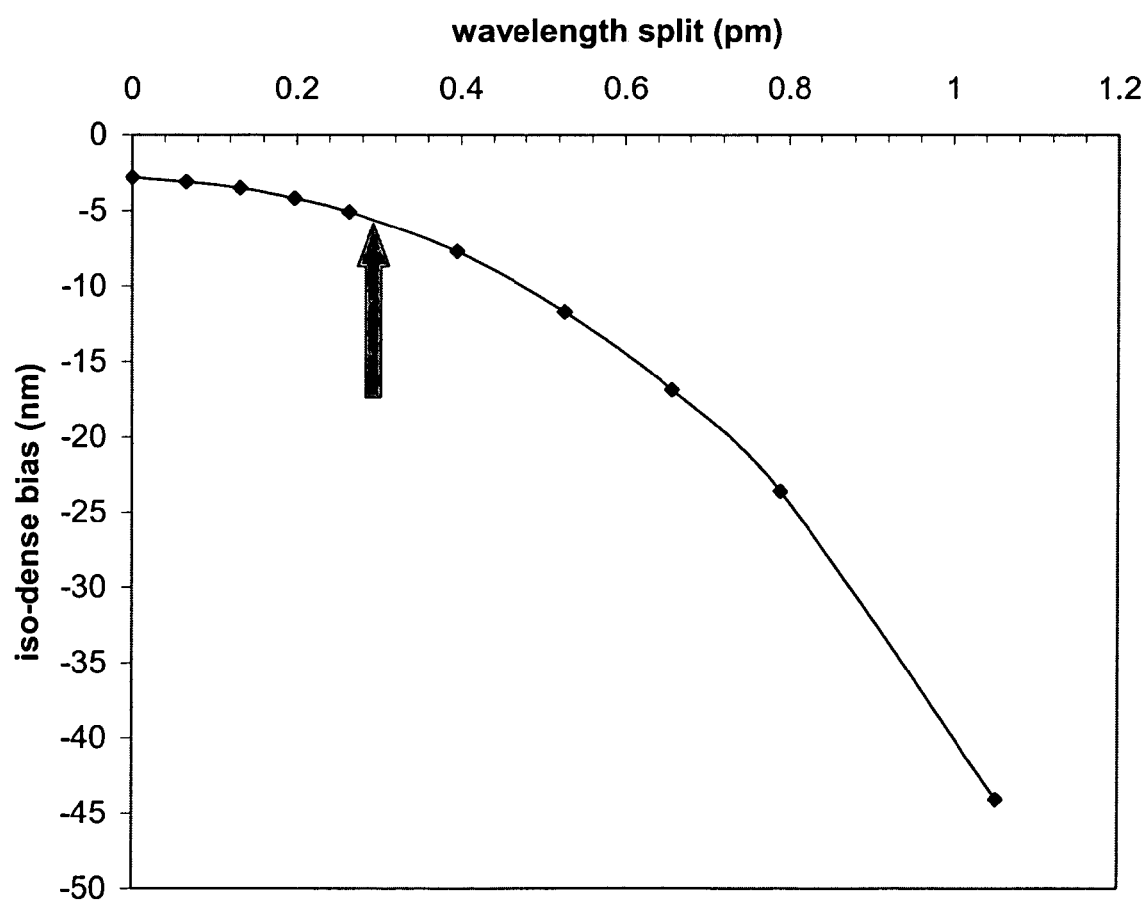
FIG. 5 depicts the effect on iso-dense bias of varying a separation of two discrete spectral peaks in a spectral energy distribution according to a further embodiment the present invention.

FIG. 5 relates to a change in iso-dense bias as a separation between two discrete spectral peaks of a spectral energy distribution is varied. The graph was created using the PROLITH (Trade Mark) modeling package.

In calculating the graph shown in FIG. 5, the nominal setting for the separation of the two discrete spectral peaks is set at 0.30 pm. In addition, the nominal setting for the iso-dense bias of the lithographic apparatus is −5 nm. The object is therefore to change, if necessary, separation of the discrete spectral peaks to maintain and control the iso-dense bias of the lithographic apparatus at −5 nm.

During the use of the lithographic apparatus, the iso-dense bias is measured by any kind of metrology tool such as CD-SEM or scatterometry. In this Example, the iso-dense bias is measured to be −5 nm which corresponds with the nominal setting (see the arrow).

When the iso-dense bias changes from −5 nm, the difference between the spectral peaks of the spectral energy distribution is changed to maintain the iso-dense bias at −5 nm. For example, if the iso-dense bias increases to more than −5 nm (i.e. more negative) in the lithographic apparatus, then the separation of the spectral peaks should be decreased so that the contribution towards the iso-dense bias in the lithographic apparatus from the separation of the spectral peaks is decreased. This allows the iso-dense bias of the lithographic apparatus to be maintained and controlled at −5 nm. On the other hand, if the iso-dense bias decreases from −5 nm (i.e. is less negative), then the separation of the spectral peaks should be increased to compensate for the reduced iso-dense bias. This once again allows the iso-dense bias to be maintained at the nominal value of −5 nm.

Although specific reference may have been made above to the use of embodiments of the invention in the context of optical lithography, it will be appreciated that the invention may be used in other applications not limited to optical lithography.

The invention claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate; and
   a projection system configured to project the patterned radiation beam onto a target portion of the substrate;
   wherein the lithographic apparatus is constructed and arranged to control and substantially maintain iso-dense bias at a nominal value when forming a pattern on the substrate by controlling the radiation beam to have a spectral energy distribution comprising two or more discrete spectral peaks separated from one another and by adjusting said separation to control and substantially maintain the iso-dense bias at the nominal value.

2. A lithographic apparatus according to claim 1, wherein the spectral energy distribution of the radiation beam has two discrete spectral peaks.

3. A lithographic apparatus according to claim 1, wherein the spectral energy distribution of the radiation beam has more than two discrete spectral peaks.

4. A lithographic apparatus according to claim 1, wherein the separation of the two or more discrete spectral peaks of the spectral energy distribution is selected from the group consisting of: less than about 5 pm; less than about 3 pm; and less than about 1 pm.

5. A lithographic apparatus according to claim 1, wherein the separation of the two or more discrete spectral peaks of the spectral energy distribution is selected from the group consisting of: less than about 0.5 pm; less than about 0.25 pm; and less than about 0.10 pm.

6. A lithographic apparatus according to claim 1, wherein the iso-dense bias is continually measured and monitored.

7. A lithographic apparatus according to claim 1, wherein the iso-dense bias in a patterned substrate is measured and compared with the nominal value for the iso-dense bias.

8. A lithographic apparatus according to claim 7, wherein when the measured iso-dense bias and the nominal value for the iso-dense bias are not equivalent, a computer modelled graph representing a separation of the two or more discrete spectral peaks of the spectral energy distribution versus iso-dense bias is used to adapt the separation of the two or more spectral peaks to control and maintain the iso-dense bias at the nominal value.

9. A lithographic apparatus according to claim 1, wherein the spectral energy distribution comprising two or more discrete spectral peaks is generated using a tuning mechanism in a radiation source to adjust a center wavelength of the radiation beam.

10. A lithographic apparatus according to claim 9, wherein the tuning mechanism to adjust the center wavelength of the radiation beam comprises a piezoelectric drive capable of oscillating a tuning mirror.

11. A lithographic apparatus according to claim 1, wherein the nominal value of the iso-dense bias is set at a value between about −1.0 nm and −10 nm.

12. A lithographic apparatus according to claim 1, wherein the nominal value of the iso-dense bias is set at −5 nm.

13. A lithographic apparatus according to claim 1, wherein the radiation beam has a wavelength corresponding to that of Deep Ultra-Violet (DUV).

14. A lithographic apparatus according to claim 1, wherein the radiation beam capable of forming the spectral energy distribution has a wavelength selected from the group consisting of: about 157 nm, about 193 nm, about 248 nm and about 365 nm.

15. A lithographic apparatus according to claim 1, wherein the radiation beam is Extreme Ultra-Violet (EUV) radiation having a wavelength in the range from about 5 nm to about 20 nm.

16. A lithographic apparatus according to claim 1, wherein the radiation beam has a wavelength of about 13.5 nm.

17. A lithographic apparatus constructed and arranged to control and substantially maintain iso-dense bias in a printed pattern on a substrate at a nominal value by generating a radiation beam having a spectral energy distribution comprising two or more discrete spectral peaks separated from one another and by adjusting said separation to control and substantially maintain the iso-dense bias at the nominal value.

18. A device manufacturing method comprising:
   projecting a patterned beam of radiation onto a target portion of a substrate;
   controlling iso-dense bias in a printed pattern on the substrate and substantially maintaining the iso-dense bias at a nominal value by causing the radiation beam to have a spectral energy distribution comprising two or more discrete spectral peaks separated from one another and adjusting said separation to control and substantially maintain the iso-dense bias at the nominal value.

19. A method as in claim 18 wherein the causing occurs at a source of the radiation.

20. A method as in claim 18 wherein the causing occurs within the a lithographic device used in the method.

21. A microelectronic device manufactured according to the method of:
   projecting a patterned beam of radiation onto a substrate;
   wherein iso-dense bias in a printed pattern on the substrate is capable of being controlled and substantially maintained at a nominal value by being capable of generating a radiation beam to have a spectral energy distribution comprising two or more discrete spectral peaks separated from one another and adjusting said separation to control and substantially maintain the iso-dense bias at the nominal value.

22. A device manufactured according to claim 21, wherein the microelectronic device is selected from the group consisting of: integrated circuits (ICs), integrated optical systems, guidance and detection patterns for magnetic domain memories, liquid crystal displays (LCDs) and thin-film magnetic heads.

23. A lithographic apparatus comprising:
   a radiation source capable of forming a radiation beam;
   a spectral energy distribution processing system capable of processing the radiation beam to create a spectral energy distribution comprising at least two discrete spectral peaks at different wavelengths separated from one another and of adjusting said separation; and
   a patterning projection device capable of applying the at least two discrete spectral peaks of the spectral energy distribution substantially simultaneously to create a pattern on a substrate.

24. A method of imaging a substrate, comprising:
   generating a beam of radiation having a spectral energy distribution;
   processing the spectral energy distribution to create at least two discrete spectral peaks separated from one another;
   adjusting said separation; and
   projecting the spectral energy distribution with the at least two spectral peaks to form a pattern in a substrate.

25. A method of imaging a substrate, comprising:
   providing, in a lithographic apparatus, a beam of radiation having a spectral energy distribution comprising at least two discrete spectral peaks separated from one another;
   adjusting said separation to control an iso-dense bias in the lithographic apparatus to be at the substantially same value as an iso-dense bias in another lithographic apparatus; and
   projecting the spectral energy distribution with the at least two spectral peaks to form a pattern in a substrate.

26. A lithographic apparatus constructed and arranged to control iso-dense bias in a printed pattern on a substrate in the lithographic apparatus to be a substantially same value as an iso-dense bias in a printed pattern on a substrate in another lithographic apparatus by generating a radiation beam having a spectral energy distribution comprising two or more discrete spectral peaks separated from one another and by adjusting said separation to control the iso-dense bias in the lithographic apparatus to be at the substantially same value as the iso-dense bias in the other lithographic apparatus.

* * * * *